(12) United States Patent
Barker (10) Patent No.: US 8,233,696 B2
(45) Date of Patent: Jul. 31, 2012

(54) SIMULTANEOUS WAFER ID READING

(75) Inventor: David Barker, Walnut Creek, CA (US)

(73) Assignee: Dynamic Micro System Semiconductor Equipment GmbH, Radofzell (DE)

( * ) Notice: Subject to any disclaimer, the term of this patent is extended or adjusted under 35 U.S.C. 154(b) by 1011 days.

(21) Appl. No.: 11/859,754

(22) Filed: Sep. 22, 2007

(65) Prior Publication Data

US 2009/0080761 A1    Mar. 26, 2009

(51) Int. Cl.
G06K 9/00    (2006.01)
(52) U.S. Cl. ......... 382/145; 382/141; 382/151; 382/312
(58) Field of Classification Search .......... 382/101, 382/102, 141–152, 321
See application file for complete search history.

(56) References Cited

U.S. PATENT DOCUMENTS

| | | | |
|---|---|---|---|
| 4,527,872 A * | 7/1985 | Gentleman et al. | 352/89 |
| 5,053,612 A * | 10/1991 | Pielemeier et al. | 235/462.42 |
| 5,227,642 A | 7/1993 | Shimizu | |
| 5,308,222 A * | 5/1994 | Bacchi et al. | 414/783 |
| 5,386,112 A * | 1/1995 | Dixon | 250/234 |
| 5,737,122 A | 4/1998 | Wilt et al. | |
| 5,894,530 A * | 4/1999 | Wilt | 382/321 |
| 5,933,521 A * | 8/1999 | Pasic | 382/145 |
| 6,002,840 A * | 12/1999 | Hofmeister | 700/245 |
| 6,168,296 B1 * | 1/2001 | Yoneda | 362/341 |
| 6,288,773 B2 * | 9/2001 | Johnson et al. | 355/77 |
| 6,809,809 B2 * | 10/2004 | Kinney et al. | 356/237.5 |
| 7,142,310 B2 * | 11/2006 | Straehle | 356/497 |
| 7,508,504 B2 * | 3/2009 | Jin et al. | 356/237.4 |
| 2004/0076321 A1 * | 4/2004 | Evans et al. | 382/141 |
| 2004/0152233 A1 * | 8/2004 | Nemets et al. | 438/106 |
| 2004/0207836 A1 * | 10/2004 | Chhibber et al. | 356/237.4 |
| 2008/0082283 A1 * | 4/2008 | Dixon et al. | 382/141 |

FOREIGN PATENT DOCUMENTS

| | | |
|---|---|---|
| EP | 1280186 | 1/2003 |
| WO | 9519012 | 7/1995 |
| WO | 9810366 | 3/1998 |

OTHER PUBLICATIONS

PCT search report and written opinion—PCT/IB2008/053826—dated Feb. 12, 2009.

* cited by examiner

*Primary Examiner* — Matthew Bella
*Assistant Examiner* — Eric Rush
(74) *Attorney, Agent, or Firm* — Tue Nguyen (57) ABSTRACT

The present invention discloses apparatuses and methods for simultaneous viewing and reading top and bottom images from a workpiece. The present ID reader can comprise an enclosure covering a top and bottom section of the workpiece with optical elements to guide the light from the workpiece images to a camera. The optical element can be disposed to receive images from a high angle with respect to the surface of the workpiece. The present ID reader can further comprise a light source assembly to illuminate the image. The light source assembly can utilize a coaxial light path with the images, preferably for bright field illumination. The light source assembly can also utilize a non-coaxial light path, preferably for dark field illumination. In an embodiment, the simultaneous images reaching the camera are separate into two distinct images on two different sections of the camera. In another embodiment, the simultaneous images reaching the camera are superimposed into one image on the camera.

13 Claims, 7 Drawing Sheets

SIMULTANEOUS WAFER ID READING

FIELD OF THE INVENTION

The present invention relates to semiconductor equipment comprising optical inspection system, and more particularly to systems and methods for viewing and reading substrate identification.

BACKGROUND

In the process of manufacturing semiconductor devices, LCD panels, and others, there are hundreds of processing equipments and thus hundreds of manufacturing steps. Robot can be used to transport workpieces, typically stored in carrier boxes, from one location to another location, from one equipment to another equipment. In a process system, a robot is typically used to remove the workpieces from the carrier boxes, and then loaded into a loadlock. Another robot can be used to move the workpiece from the loadlock into a processing chamber, and from one processing chamber to another processing chamber. The processing system could be a stocker system, a sorter system, an ID reader system, a deposition system, an etch system, a lithography system, a metrology system, an inspection system, an implantation system, a treatment system, or any workpiece processing system.

It is very important to keep track of the flow of the wafers, flat panels, LCDs or reticles (hereafter workpiece) throughout the different processing steps, and to locate a particular workpiece at any given time. Further, it is desirable to be able to identify the workpiece to verify the appropriate processing steps designed for that workpiece. Thus typically each workpiece carries an identification (ID) mark before entering the fabrication facility. The mark can be read at an ID reader station, or at any processing station equipped with a reader. For semiconductor wafer, the mark is typically a bar code or a sequence of characters etched or scribed at an upper or lower surface near the outer circumference. The marked locations are typically at a standard location on one of its principal surfaces, usually adjacent a flat or notch on the periphery of the wafer so that the location of the mark can be determined through the orientation of the wafer.

The workpieces are generally processed with their top surface facing upward, but in some applications, workpieces are processed in both top up and top down orientations. Further, while the ID marks are typically on the top surface, some are located on the bottom surface. Thus, for high throughput workpiece identification, both sides of the workpiece would need to be read simultaneously. To read both sides of the substrate simultaneously using conventional systems typically requires two cameras and illumination systems with serious drawback for the utilization of a second system, such as space requirement, obstruction issue, equipment modification, and associated cost.

SUMMARY

The present invention discloses apparatuses and methods for singularly or simultaneous viewing and reading top and bottom images from a workpiece. In exemplary embodiments, the images can be the identification (ID) marks, etched or scribed on the peripheral edge of the workpiece with alphanumeric characters or barcodes. The assembly can comprise image recognition software, such as OCR, for converting the receiving images into objects that the computer can easily understand and distinguish.

In an embodiment, the present ID reader comprises an enclosure covering a top and bottom section of the workpiece with optical elements to guide the light from the workpiece images to a camera. The optical element can be disposed to receive images from a high angle with respect to the surface of the workpiece. The high angle is preferably normal, or in the vicinity of the normal angle with the workpiece surface. The ID reader can enclose the workpiece edge from a side or from a back side to allow workpiece forward movement. With the enclosure, the image contrast can be significantly improved by reducing stray light or interference light from ambient.

In another embodiment, the optical elements comprise optical reflective elements such as mirrors or prisms disposed within the enclosure to prevent interference. External optical elements may also be used.

In another embodiment, the present ID reader comprises a light source assembly to illuminate the image. The light source assembly can utilize a coaxial light path with the images, preferably for bright field illumination. A beam splitter can be disposed on the light path for providing the coaxial light path, for example, a straight path for the image directly to the camera, and a reflected path for the light source. The light source illuminating the top and bottom sections of the workpiece can comprise one or two different light sources. One light source for both images can simply the fabrication process, and two light sources permit independent controls. The light source assembly can utilize a non-coaxial light path, preferably for dark field illumination. The light source for dark field illumination can be disposed at a low angle with respect to the workpiece surface, and preferably directed toward the workpiece away from the camera lenses to prevent interference. The light source assembly can further comprise filter to control the wavelengths of sending and receiving images, thus further improving the signal to noise contrast ratio. The light source assembly can comprise LED or incandescent light sources. The assembly can further comprise a controller, preferably controlled by a computer, to manipulate the angles, the intensities and the wavelengths of the bright field and dark field light sources.

In an embodiment, the simultaneous images reaching the camera are separate into two distinct images on two different sections of the camera. Separate controls of the light sources can be utilized to achieve best performance for both images. In another embodiment, the simultaneous images reaching the camera are superimposed into one image on the camera. In exemplary embodiments, the ID marks are presented on only one side of the workpiece, thus by superimposing the top and bottom images, the camera always captures the ID marks at the same section of the camera, even if the ID marks are scribed on top or bottom surface, or the workpiece disposed upside down or upside up. Further, the light controls can be independent manipulated to highlight the ID marks area. For example, if the ID marks are located on the top surface, the light intensities, wavelengths or angles for the bottom surface can be changed to maximize the ID marks contrast.

The present ID reader assembly can rotate around the workpiece to search for the ID marks. In an embodiment, the ID reader can be integrated into an aligner assembly, which includes a rotation mechanism such as a rotating chuck, for providing the rotation and centering of the workpiece. The present ID reader or reader/aligner assembly can be integrated into a robot assembly, allowing centering and ID reading in the same time as the movements of the robotic mechanism, thus potentially improving throughput.

The present ID reader or reader/aligner assembly can be used in a sorter or stocker equipment, such as a wafer sorter or stocker, a LCD sorter or stocker, or a reticle sorter or stocker.

It can also be used in processing equipment such as deposition, etching, track, lithography exposure, developer, and bake. It can also be used in transport workpieces from a loadlock to a buffer, or to a process chamber, to a storage chamber, or to a sorter chamber. It can also be used in Front End loader, to transfer workpieces from FOUPs to loadlocks.

DETAILED DESCRIPTION OF THE EMBODIMENTS

The present invention is directed to an optical system for viewing of a plurality of marks in a semiconductor workpiece. In an exemplary embodiment, the present optical system can perform reading of wafer ID located either in the top or bottom surface. In another exemplary embodiment, the present optical system can perform simultaneous reading of wafer ID located in top and/or bottom surfaces. The present optical system provides a simple and reliable mechanism in simultaneously receiving top and bottom wafer ID. The compact size of the optical system can enable a reduction in package size and simplifies mounting. The configuration of the optical elements such as prism optics can offer horizontal packaging of the camera which is beneficial to on-board integration of OCR capabilities, particularly in two end-effector applications. Further, contrast can be improved with reduction in interference light from environment during the illumination of the wafer. The description describes the optical system in relation to wafer, but it can be applied to a general semiconductor workpiece, such as reticle, flat panel, etc.

The present optical system can provide highly accurate, repeatable, and robust character reading results for varying lighting conditions, image distortions, varying contrast levels, rotation skewed or misaligned, or partially obscured. The present optical system can also read wafer ID on both sides of the substrate using one camera and illumination system.

Figure 1A:
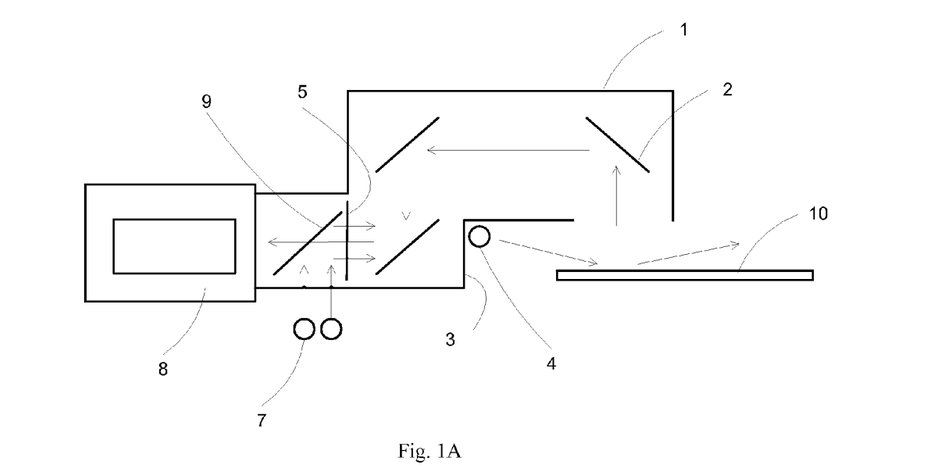
FIG. 1A illustrates an embodiment of the present invention ID reader shown reading the top surface.

FIG. 1A illustrates an exemplary embodiment of the present ID reader, configured to read the ID mark on the top surface of a substrate 10. The reader comprises a set of optical elements 2, guiding the image from the top surface of the substrate to the camera 8. The optical elements 2 as shown consists of three components, such as mirror or prism, and offers horizontal mounting of the camera 8. Integrated and coaxial light source 7 can offer bright field illumination through the beam splitter 9, and through the same optical elements. A filter 5, such as a low pass filter, a high pass filter or a band pass filter, can select the proper wavelengths of the image and light source, thus preventing interference from stray ambient light. An optional light source 4 provides light at a low angle with the substrate surface for dark field illumination. The assembly is enclosed with a top enclosure 1 and a bottom enclosure 3 to block out ambient light.

Figure 1B:
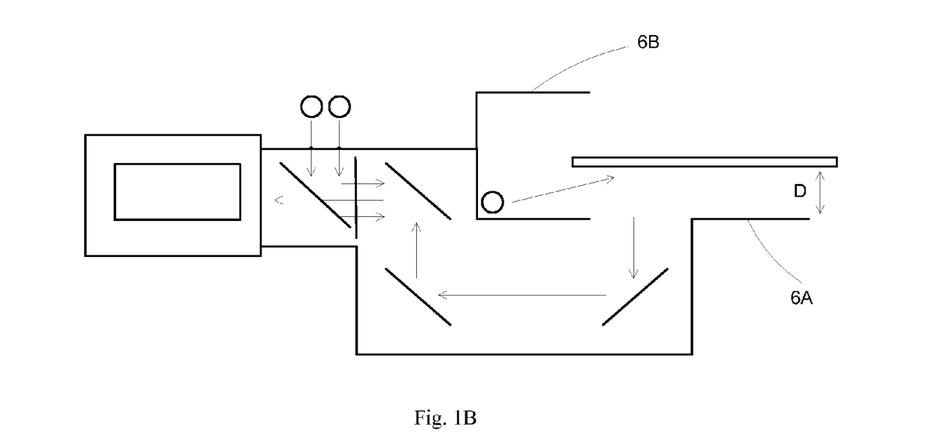
FIG. 1B illustrates another embodiment of the present invention ID reader shown reading the bottom surface.

FIG. 1B illustrates an exemplary embodiment of the present ID reader, shown to read the ID mark on the bottom surface of a substrate 10. The same reader can be configured to read the top surface by rotating 180 degrees. The reader can further comprise optional enclosures 6A and 6B for preventing ambient light. The enclosure can be close to the substrate surface, for example, the distance D between the enclosure 6A and the substrate 10 can be less than 10 mm, preferably less than 5 mm, and more preferably less than 1 or 2 mm. The enclosure can also configured to ensure that minimum ambient light can read the optical elements 2 at the right angle, thus essentially preventing all ambient light from reaching the camera.

Figure 2:
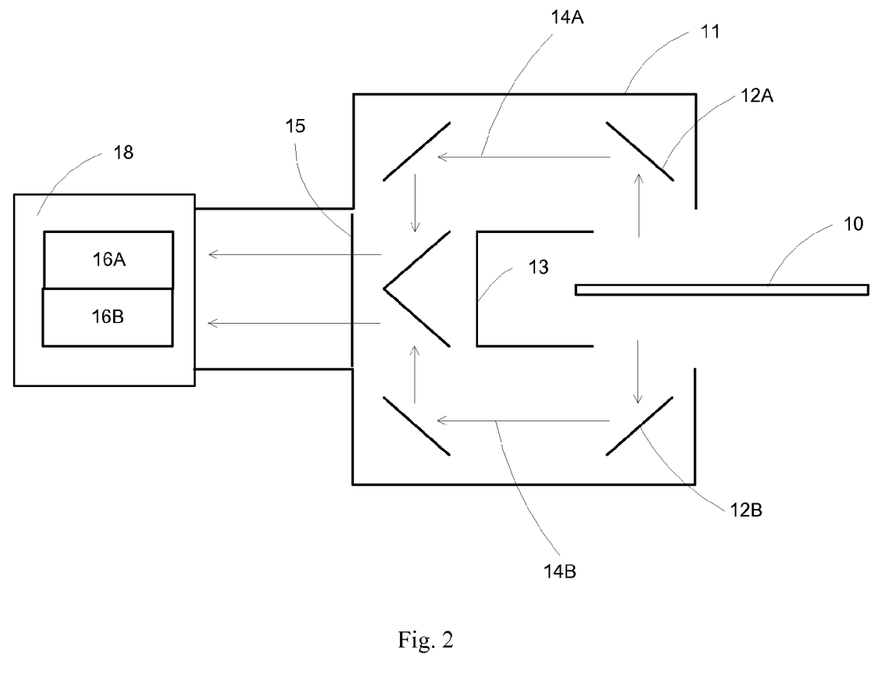
FIG. 2 shows an embodiment of the present invention simultaneous ID reader with separate images.
Figure 3:
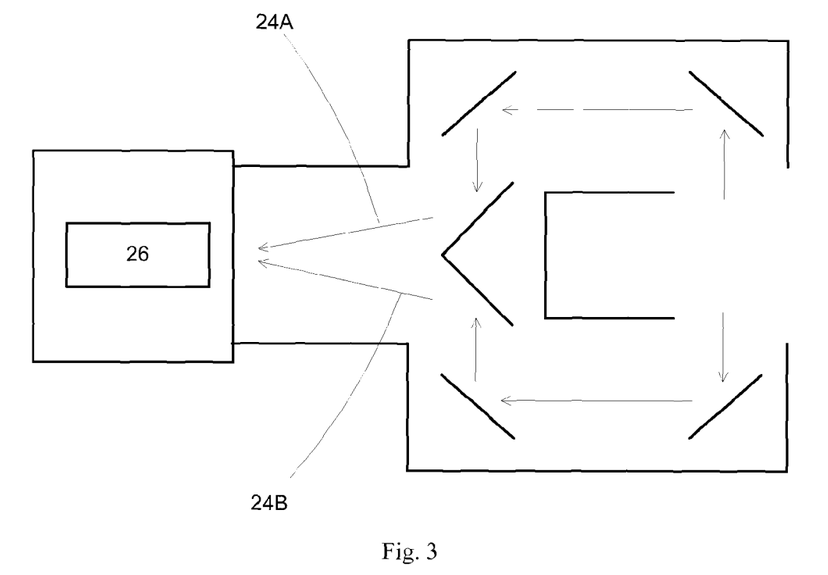
FIG. 3 shows another embodiment of the present invention simultaneous ID reader with superimposed image.

FIG. 2 shows an embodiment of the present invention optical system, comprising two sets of light bending optical elements 12A and 12B and a camera 18. Each set of optical elements shown comprise three optical reflector, reflecting images from the top and bottom of a wafer 10 into the camera 18. The optical reflectors are housed in an enclosure 11. The images from the top and bottom of the wafer follow two light paths 14A and 14B, reaching different sections 16A and 16B of the camera 18 respectively to form two separate images. The assembly can further comprise an optional inner liner 13 and an optional filter 15 for improving image collection, for example, by preventing stray lights from entering the camera, FIG. 3 shows another embodiment of the present invention simultaneous ID reader. The optical elements are arranged so that the top and bottom images are superimposed on the camera. The light paths 24A and 24B can be converged to the camera lenses 26 to form a superimposed image. The light paths can merge, for example, by beam splitter or optical configurations to form a superimposed image on the camera.

Figure 4:
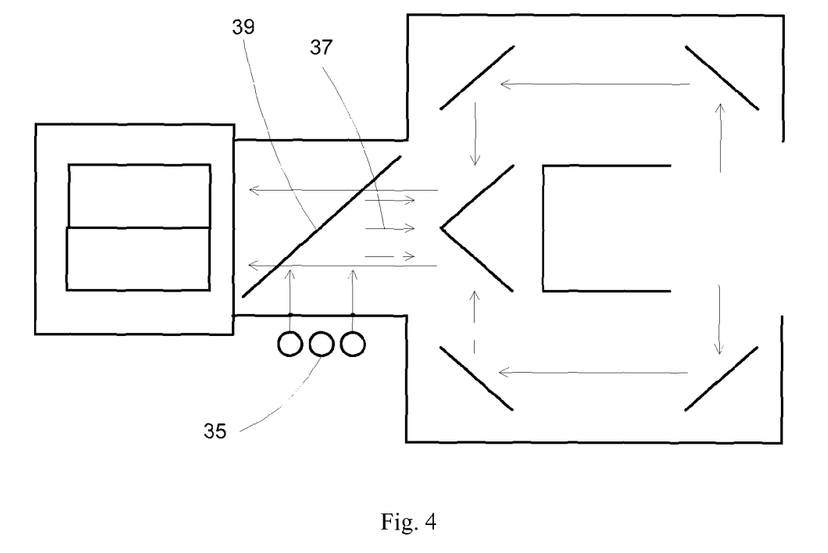
FIG. 4 shows another embodiment of the present invention simultaneous ID reader with beam splitter light source.

FIG. 4 shows another embodiment of the present invention simultaneous ID reader. The ID reader comprises an optional array of light sources 35. A beam splitter 39 is position in front of the camera to provide pathway for both the image and the illumination light source. The beam splitter 39 is designed to provide coaxial light from the light source 37 and light from the image. The beam splitter 39 thus reflects light from the light sources toward the wafer in the optical assembly and allows reflected light back to pass into the camera. The images from the top and bottom of the wafer can be separated images, as shown by separate light paths reaching different sections of the camera to form two separate images. The images from the top and bottom of the wafer can be superimposed, meaning the light paths from the top and bottom of the wafer are reaching the same section of the camera, forming a superimposed image.

Figure 5:
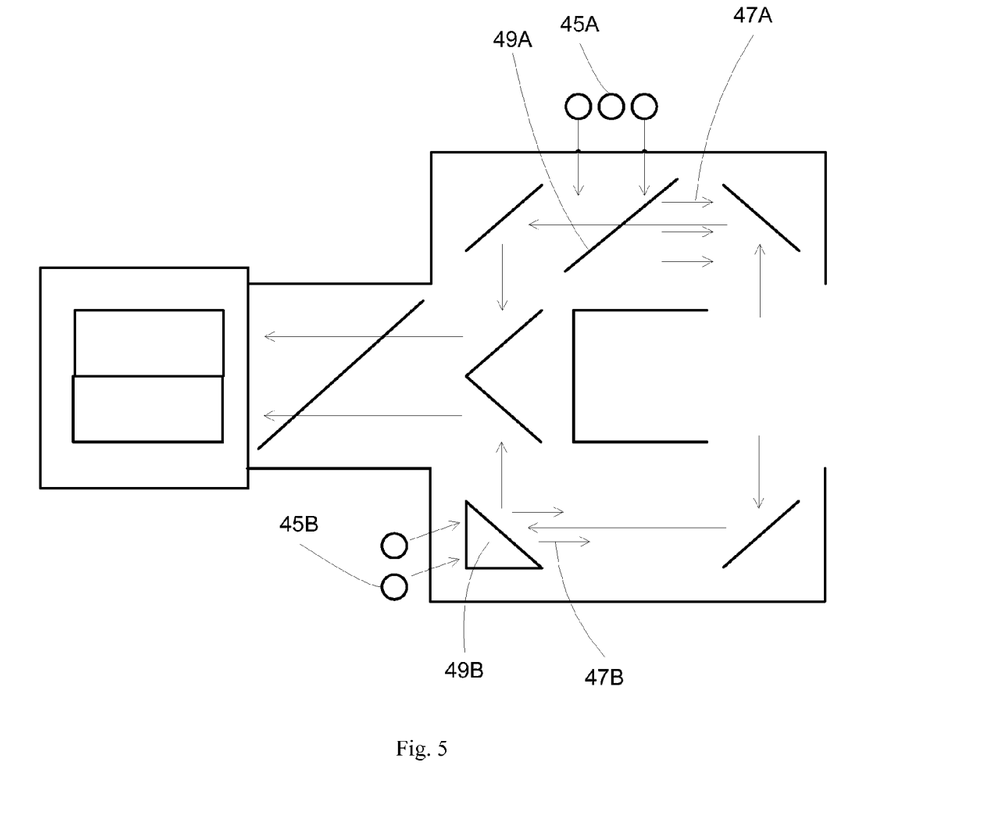
FIG. 5 shows another embodiment of the present invention simultaneous ID reader with various light source configurations.

FIG. 5 shows another embodiment of the present invention simultaneous ID reader with various light source configurations. A light source 45A can be located on an optical light path, using optical element such as a beam splitter 49A to provide coaxial light 47A to the image. A light source 45B can provide light 47B through a prism 49B to the image.

Figure 6:
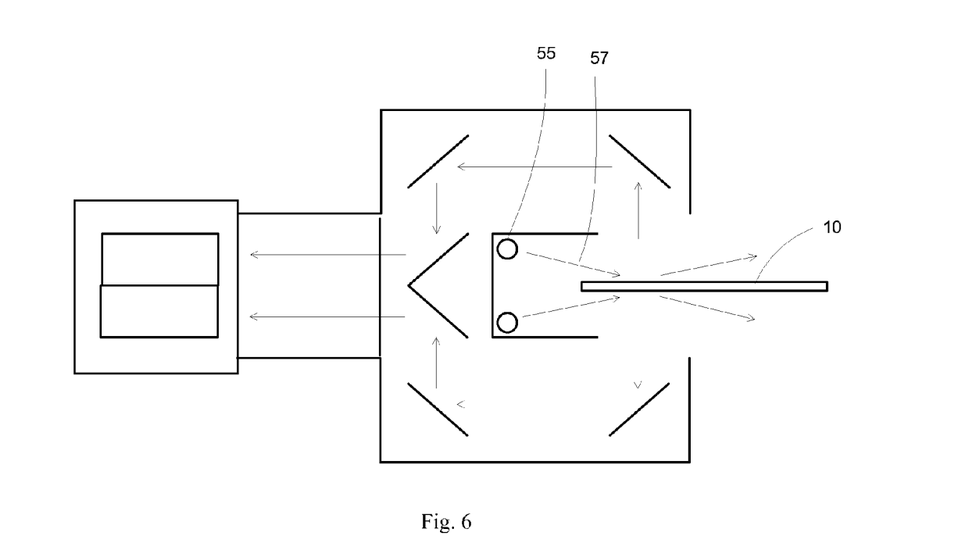
FIG. 6 shows another embodiment of the present invention simultaneous ID reader with dark field light source configurations.

FIG. 6 shows another embodiment of the present invention simultaneous ID reader with dark field light source configurations. The light source 55 provides low angle light 57 to the wafer 10, and the ID marks reflect scattered light to be captured by the camera. Optional filter, angle and intensity control can be implemented for optimizing the dark field illumination.

Figure 7:
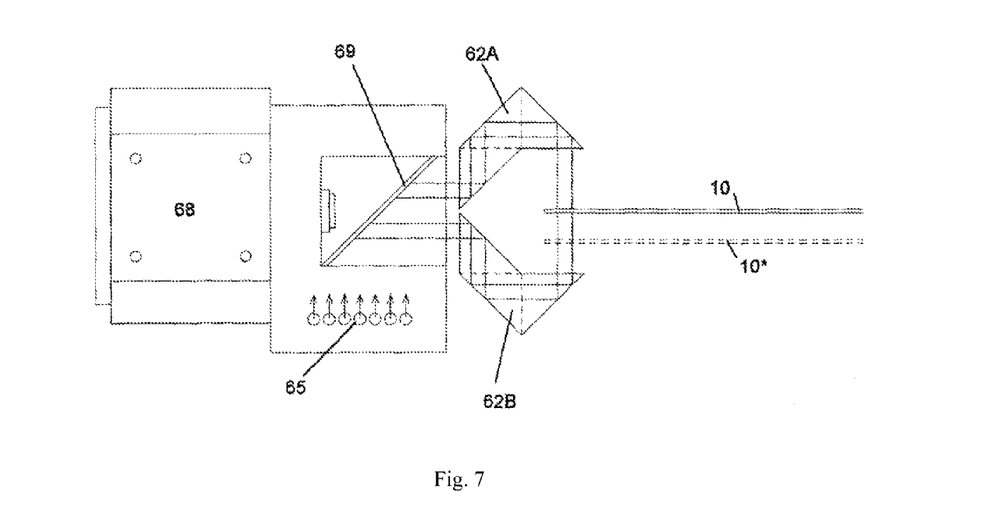
FIG. 7 shows another embodiment of the present invention simultaneous ID reader.

FIG. 7 shows another embodiment of the present invention simultaneous ID reader, comprising two sets of prisms 62A and 62B, a camera 68 and an optional array of light sources 65. A beam splitter 69 is position in front of the camera to provide pathway for both the image and the illumination light source. The wafer can be in transfer position 10* or in lift position 10**.

The images from the top and bottom of the wafer can be separated images, as shown by separate light paths reaching different sections of the camera to form two separate images. The images from the top and bottom of the wafer can be superimposed, meaning the light paths from the top and bottom of the wafer are reaching the same section of the camera, forming a superimposed image. Alternatively, the light sources can be positioned near the prisms to provide illumination lights (not shown), or near the wafer to provide light source at a shallow angle for dark field illumination.

The camera is preferably a single camera having an image sensor and optional lens for focusing. The optical elements can be optical reflecting elements such as mirrors or prisms, and can be selectively positioned within the enclosure to either divide the camera field into two portions, or to superimpose the camera field into one single image. The enclosure protrudes minimally into the wafer for reading the identification. The total system can be disposed on the sides of the substrate. A machine vision can be further included for ID optical character recognition and ID verification.

The wafer is preferably positioned within an opening of the enclosure, thus preventing interference light coming from the environment. The optical paths for the top and bottom wafer can be configured to be symmetrical, thus providing ease of focus for the camera. Alternatively, the wafer can be positioned outside of the enclosure to allow wafer movement without limitation. In this case, addition mirrors can be provided. The optical viewing system can provide perpendicular viewing from the substrate or at an angle to the normal. The interior surfaces of the enclosure can be treated, e.g. painted matt black, to minimize stray reflections.

Figure 8A:
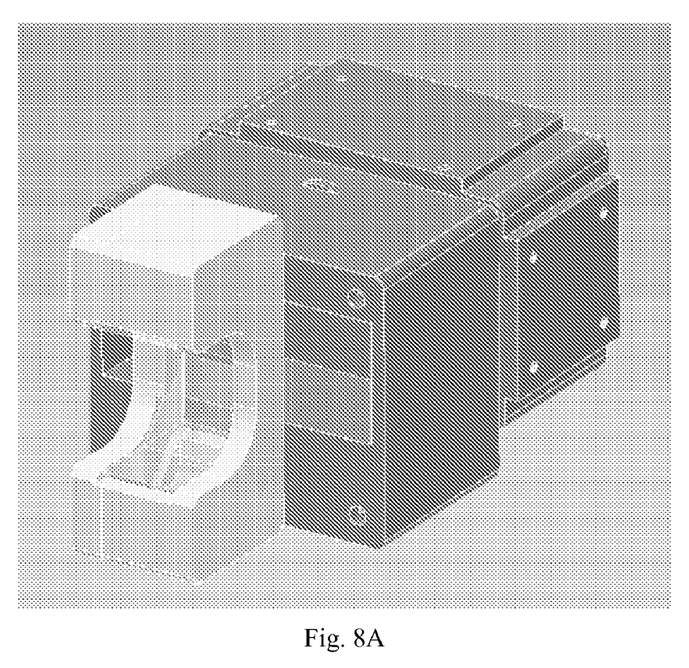
FIG. 8A shows a perspective view of an embodiment of the present invention simultaneous ID reader.
Figure 8B:
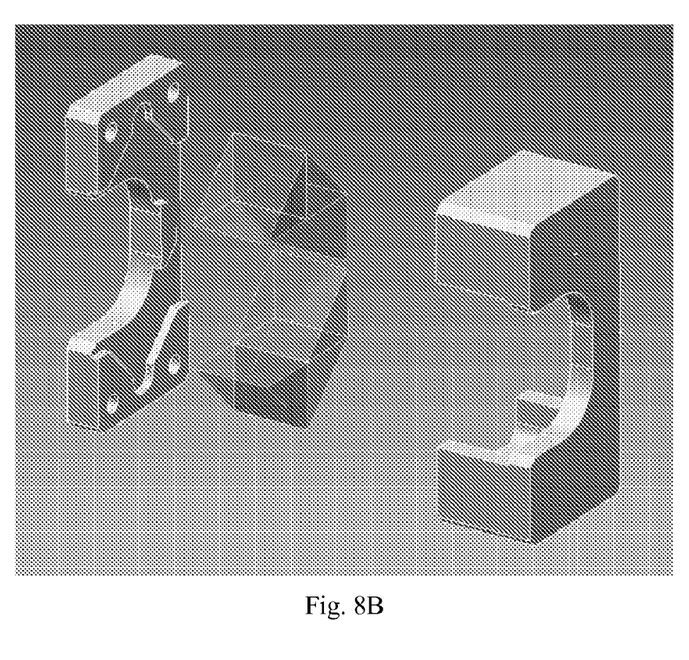
FIG. 8B shows a perspective view of an embodiment of the enclosure and prism optical elements.

FIG. 8A shows a perspective view of an embodiment of the present invention simultaneous ID reader. FIG. 8B shows a perspective view of an embodiment of the enclosure and prism optical elements. The enclosure comprises two mating brackets holding the prisms in the middle area. The enclosure further includes an opening, where the wafer can enter to read the ID.

Figure 9:
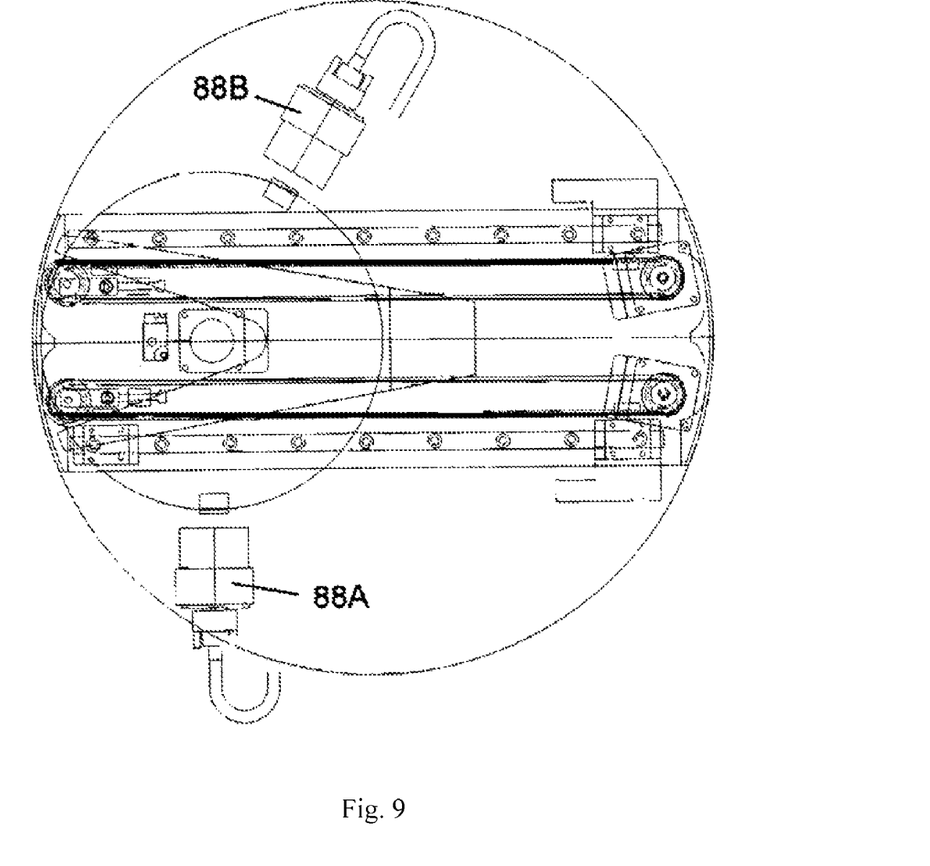
FIG. 9 shows another embodiment of various mounting configurations of the present invention simultaneous ID reader.

FIG. 9 shows an embodiment of the wafer ID reader system, together with a robotic mechanism. The wafer ID reader system 88A or 88B can disposed at the sides of the wafer movement, such as perpendicular to the robot arm, or making a backward angle.

In exemplary embodiments, the present invention discloses illumination light sources for different types of ID marks. For example, a bright field assembly with bright field light guide can be used for bright field illumination, and a dark field high angle assembly with dark field light guide can be used for dark field illumination. In certain embodiments, only one type of lighting is used at a time, and configurations having different number of light field and dark field assemblies may be employed.

In bright field illumination, incident light strikes the wafer at a near normal angle (greater than 70 degrees) with respect to the wafer surface. The reflected light from the field of semiconductor wafer exhibits the same high angle, and captured by the camera, making the field appear bright. Light from ID marks is widely scattered, and the ID appears dark in comparison to the field.

In dark field illumination, incident light strikes the wafer at a low angle (less than 30 degrees) with respect to the wafer surface. The camera is positioned at a high reflected angle as in the case of bright field illumination, and does not capture the light reflected from the low angle incident. The wafer field appears dark. Much more scattered light from the ID marks will reach the camera, making the ID appearing bright. The optical elements or light guides are chosen of high quality optic, such as optical quality glass or optical quality acrylic to prevent light loss.

The ID marks also underwent processing, for example deposition or etching over the mark. The ID mark therefore must show through such processing steps. The ID marks are typically the same color as the wafer substrates with little relief since the wafer surface is polished. The ID mark also may undergo several etching processes or several coating processes that cover the characters, further reducing their size and relief.

The ID mark can be soft mark, generally created by a laser, and characterized by shallow depressions with smooth edges, and lack well-defined edges. The ID mark can be hard mark, generally created by a diamond stylus, and characterized by sharp edges. Though hard marks are easier to read, it can generate particles, and thus the use of soft marks is more popular. The ID mark is typically located in fixed, known position with respect to a landmark, such as a notch or a flat. Thus, in order to locate the ID mark, wafers can be rotated under a sensor to identify the radial position of the landmark. And then the wafer can be further rotated to the position of the ID mark and the ID mark then may be read.

The light sources further address processing irregularities, such as edge bead problem or deposited films obscuring the ID marks. The edge bead removal marks typically do not provide high angle scattering, but having differing reflectivity. Thus, light striking the edge bead marks does not significantly scattered toward the camera, causing little change in contrast, allowing for ID reading of wafers with edge bead removal marks. Similarly, thin films of deposited materials of organic or inorganic materials can obscure the ID due to differing reflectivity or absorption, but also do not exhibit significant high angle scattering, and thus can be read using bright field light source.

The reading of wafer ID may be based on contrast difference, e.g. optical property, between the wafer ID and the surrounding region. The contrast difference is generally due to the wafer ID mark, disposed on a highly reflective substrate. The light scatters differently on the mirror-like field and on the wafer ID marks. The wafer ID hard mark scribes a relatively deep trench into the surface of semiconductor wafer.

The present optical system can provide illumination for reading various types of scribe marks. Further, the system can read partial obscured ID marks due to, for example, edge bead removal, etching or deposition processes. The system can be insensitive with respect to environmental lighting.

The light sources are preferably visible light, but light of any frequencies can be employed. Also band pass filters can be used to allow only certain wavelengths of light, thus eliminate stray light of other wavelengths from other sources in the environment. The intensity of the light sources can vary, either manually or automatically.

Light sources can be any light emitter, and LEDs is preferably for short start up time, thus allowed for intensity variation to achieve best OCR accuracy. The light source can be a collimator for providing a series of parallel beams of light. Light controller can be implemented to change the intensity, the wavelength, or direction of the light emitted from the light source. The light controller can be implemented with microelectronics, such as a light card installed in a PC controller. The bright field light source is preferably normally coaxial with the image light reflected back from the wafer. The dark field light source is preferably non-coaxial.

The light sources can include LEDs for illuminating soft marks and broad spectrum incandescent lamps for illuminating hard marks. The light control unit can comprise feedback circuitry to adjust the source and intensity of light with software-controlled switching. In certain embodiments, incandescent lamps can provide advantages over LEDs because of the broader spectrum of wavelengths and the insensitivity to the interference effects resulting from thin film depositions.

The present enclosure can further serve as a shield to block room light. In certain embodiments, the present ID reader provides a protection mechanism to protect against parasitic ambient illumination. The wafer enters the enclosure through the front opening with minimum gap (order of mm), thus preventing stray light from interfering with imaging operation. Together with the integrated light sources, the effect of room light on the image contrast can be significantly reduced or eliminated. Also, the incorporation of a band pass filter may further eliminate the noise or interference signal. For example, the employed light sources can provide light of a wavelength in the 640-660 nm range. Using a band pass filter for wavelengths greater than 630 nm and less than 670 nm, all other wavelengths are prevented from reaching the camera. The light source and the filter can be chosen to offset the room light spectrum, for example the blue end of the spectrum. Thus, there is very little light noise at the camera wavelength from the room lighting, exhibiting very little effect on image contrast.

Figure 10:
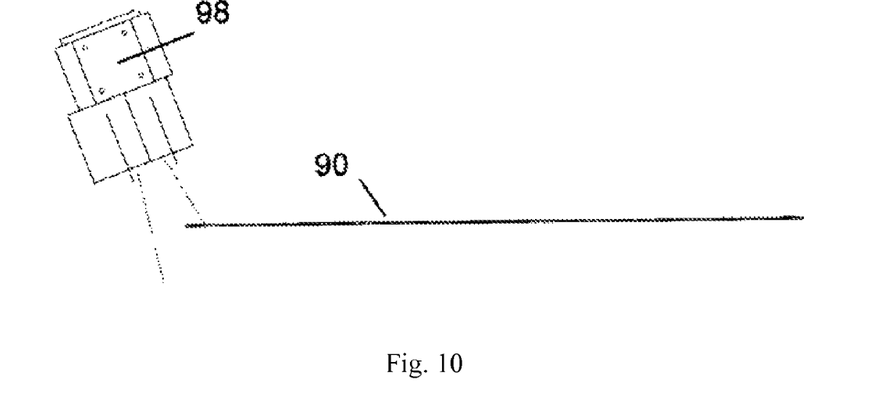
FIG. 10 shows another embodiment of the present invention simultaneous ID reader.

Alternatively, FIG. 10 shows an embodiment where the ID reader 98 is mounted outside the wafer 90. If horizontal mounting where the wafer enters the opening of the enclosure is not practical, for example due to the potential movement of the wafer, then the ID reader may be mounted at an angle to clear the paddle-bracket travel zone.

The optical reflector may comprise a plane mirror or a prism, with the surface area preferably larger than the ID to be read. The optical reflectors are mounted on a rigid housing, thus providing precise transmission of wafer ID image.

The wafer ID reader may include a software component for identifying the ID characters based on the image observed. The image processing software can convert the image to alphanumeric characters, and transmit them to a computer for further processing. The image processing software can include optical character recognition (OCR) software.

In an embodiment, the present invention provides the viewing and reading of identification marks, disposed on either side of a substrate. The optical elements can be positioned to view both images of ID marks in different sections of the camera. For example, top/bottom images being displayed on top/bottom sections of the camera respectively. The optical elements can be positioned to superimpose both images of ID marks in the same section of the camera. Since in many situations, the ID marks is present in one side of the substrate, superimposing the top and bottom images of the substrate always provides the ID mark, regardless of the wafer orientation or where the mark is scribed.

In an embodiment, the simultaneous ID reader of the present invention can be incorporated in an ID reader equipment such as an aligner. The aligner can locate the ID marks, and the ID reader can read and OCR the marks. The aligner/reader is then capable of identifying the substrate. The aligner can also center the substrate and orient the substrate to a particular location, such as a notch or a flat. The aligner/reader station can be stationed as a stand alone unit, or as part of a processing station. A wafer handling robot might be also provided for accessing and transferring wafers to the aligner/reader, for example, from a cassette. The robot can include an end effector, and can be controlled by a computer. In another embodiment, the aligner/reader can be integrated with the robotic assembly, thus providing the wafer aligning and reading action during the robotic movement.

The aligner can include a rotation mechanism, such as a rotating chuck, for rotating the substrate. The substrate is deposited on the chuck, for example, by the robot transferring the substrate from a cassette to the chuck. In the case of integrated aligner/reader station, the movement from the robot to the chuck can be eliminated since the chuck is located within the robot. The chuck then rotates the substrate to identify the location of the ID mark and/or to determine the wafer center. Optional wafer centering can be performed before or after the rotation process. The aligner can include sensors for identifying the notch, flat or any special marking on the substrate. After the position of the substrate has been identified, the ID mark can be positioned in the reader, for example, by rotating the substrate a pre-determined amount. Both sides of the substrate can then be read simultaneously. The rotation of the substrate can also be used to determine the center of the substrate.

In an aspect, the object alignment subsystem comprises a rotation chuck, disposed on the robot body, and thus moving with the robot movements. Thus the object can be aligned during the movement of the robot body. The alignment can be to a notch, a flat, or to the orientation of the wafer ID. The rotation chuck preferably comprises a holding mechanism, such as vacuum suction to hold the object during the rotation process. The alignment subsystem can further comprise a centering mechanism, such as pressing pins or bars.

In an aspect, the object identification subsystem comprises an OCR assembly or a wafer ID reading assembly, disposed on the robot body, and thus moving with the robot movements. Thus the object can be identified during the movement of the robot body. The ID reading can be done from the top or the bottom of the object. The object identification subsystem can be disposed on the robot end of the end effector, if this position would not interfere with the functionality of the end effector. ID tracking mechanism can also be provided to allow the object identification subsystem to find the object ID.

The alignment assembly further can comprise a plurality of sensors, such as workpiece positioning sensors, image sensing of position errors, RF electric field sensing, magnetic resonance sensing, laser scanning, sensing with photo detector arrays, motor operation sensing, arm position sensing, or any sensors related to the operation and service. Furthermore, the sensors can provide the status and locations of the assembly, thus allowing the optimum utilization of the remaining operative part of the assembly, plus the alerting the operator for servicing the inoperative parts of the assembly.

The present invention robot assembly can be used in a sorter or stocker equipment, such as a wafer sorter or stocker, a LCD sorter or stocker, or a reticle sorter or stocker. It can also be used in processing equipment such as deposition, etching, track, lithography exposure, developer, and bake. It can also be used in transport workpieces from a loadlock to a buffer, or to a process chamber, to a storage chamber, or to a sorter chamber. It can also be used in Front End loader, to transfer workpieces from FOUPs to loadlocks.

What is claimed is:

1. An aligner/reader for simultaneous reading top and bottom sections of a workpiece, comprising:
   a rotating chuck for rotating the workpiece;
   an enclosure with an opening, the opening enclosing a portion of the workpiece during the workpiece rotation, wherein the enclosure does not enclose the whole workpiece;
   a sensor for identifying an orientation of the workpiece;
   a camera in communication of the enclosure;
   a first light bending assembly disposed within the enclosure to guide a first pathway from the top section of the workpiece to the opening and to the camera; and
   a second light bending assembly disposed within the enclosure to guide a second pathway from the bottom section of the workpiece to the opening and to the camera.

2. An aligner/reader as in claim 1 further comprising a coaxial light source for illuminating the workpiece at a substantially normal angle with the workpiece surface, and a non-coaxial light source for illuminating the workpiece at an acute angle with respect to the workpiece surface, and wherein the coaxial light source and the non-coaxial light source are shielded from each other.

3. An aligner/reader as in claim 1 wherein the first and second light bending assemblies simultaneously form separate images in the camera.

4. An aligner/reader as in claim 1 wherein the first and second light bending assemblies form a superimposed image in the camera.

5. An aligner/reader as in claim 1 further comprising a first light beam to provide a bright field image and a second light beam to provide a dark field image to be received by the camera.

6. An aligner/reader as in claim 1 wherein the camera is configured to receive images from the top section and the bottom section of the workpiece, wherein the top section and the bottom section each comprises a portion of a peripheral edge of the workpiece, and wherein the top section and the bottom section are substantially smaller than the whole workpiece.

7. A robotic assembly comprising:
   an end effector for transferring a workpiece;
   a rotating chuck coupled to the body of the robotic assembly for rotating the workpiece during workpiece transferring;
   an enclosure with an opening, the opening enclosing a portion of the workpiece during the workpiece rotation, the enclosure coupled to the body of the robotic assembly, wherein the enclosure does not enclose the whole workpiece;
   a camera in communication of the enclosure;
   a first light bending assembly disposed within the enclosure to guide a first pathway from a top section of the workpiece to the opening and to the camera; and
   a second light bending assembly disposed within the enclosure to guide a second pathway from a bottom section of the workpiece to the opening and to the camera,
   wherein the camera reads the top and bottom of the workpiece simultaneously for ID mark identification.

8. A robotic assembly as in claim 7 further comprising a coaxial light source assembly, wherein the coaxial light source assembly utilizes a portion of the light pathways in the light bending assemblies for illuminating the workpiece.

9. A robotic assembly as in claim 8 further comprising a non-coaxial light source for illuminating the workpiece at an acute angle with respect to the workpiece surface, wherein the coaxial light source and the non-coaxial light source are shielded from each other.

10. A robotic assembly as in claim 7 wherein the first and second light bending assemblies simultaneously form separate images in the camera.

11. A robotic assembly as in claim 7 wherein the first and second light bending assemblies form a superimposed image in the camera.

12. A robotic assembly as in claim 7 further comprising a first light beam to provide a bright field image and a second light beam to provide a dark field image to be received by the camera.

13. A robotic assembly as in claim 7 wherein the camera is configured to receive images from the top section and the bottom section of the workpiece, wherein the top section and the bottom section each comprises a portion of a peripheral edge of the workpiece, and wherein the top section and the bottom section are substantially smaller than the whole workpiece.

* * * * *